(12) United States Patent
Martin et al.

(10) Patent No.: US 8,304,861 B2
(45) Date of Patent: Nov. 6, 2012

(54) SUBSTRATE BONDING WITH BONDING MATERIAL HAVING RARE EARTH METAL

(75) Inventors: John R. Martin, Foxborough, MA (US); Christine H. Tsau, Arlington, MA (US); Timothy J. Frey, Hudson, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/161,102

(22) Filed: Jun. 15, 2011

(65) Prior Publication Data

US 2011/0241176 A1 Oct. 6, 2011

Related U.S. Application Data

(62) Division of application No. 12/434,886, filed on May 4, 2008, now Pat. No. 7,981,765.

(60) Provisional application No. 61/095,754, filed on Sep. 10, 2008.

(51) Int. Cl.
*H01L 29/06* (2006.01)

(52) U.S. Cl. ............... 257/618; 257/E29.002; 438/455

(58) Field of Classification Search ................. 257/618, 257/E29.002; 438/113, 455
See application file for complete search history.

(56) References Cited

U.S. PATENT DOCUMENTS

| | | | |
|---|---|---|---|
| 6,537,831 B1 | 3/2003 | Kline | 438/14 |
| 7,018,484 B1 * | 3/2006 | Atanackovic | 148/33.3 |
| 7,132,721 B2 | 11/2006 | Platt et al. | 257/414 |
| 7,344,901 B2 * | 3/2008 | Hawtof et al. | 438/26 |
| 7,425,166 B2 | 9/2008 | Burt et al. | 445/25 |
| 7,692,521 B1 * | 4/2010 | Cohn | 335/78 |
| 8,008,739 B2 * | 8/2011 | Ishii | 257/417 |
| 2003/0000926 A1 * | 1/2003 | Senor et al. | 219/76.13 |
| 2003/0013969 A1 | 1/2003 | Erikson et al. | 600/459 |
| 2005/0181579 A1 | 8/2005 | Thallner | 438/455 |
| 2005/0280635 A1 * | 12/2005 | Hinata | 345/173 |
| 2006/0220223 A1 * | 10/2006 | Lu et al. | 257/704 |
| 2007/0295456 A1 | 12/2007 | Gudeman et al. | 156/379.7 |
| 2008/0122073 A1 | 5/2008 | Yen | 257/723 |
| 2008/0157651 A1 | 7/2008 | Yoo et al. | 313/495 |
| 2008/0237823 A1 * | 10/2008 | Martin | 257/685 |

* cited by examiner

*Primary Examiner* — Phuc Dang
(74) *Attorney, Agent, or Firm* — Sunstein Kann Murphy & Timbers LLP

(57) ABSTRACT

A microchip has a bonding material that bonds a first substrate to a second substrate. The bonding material has, among other things, a rare earth metal and other material.

22 Claims, 3 Drawing Sheets

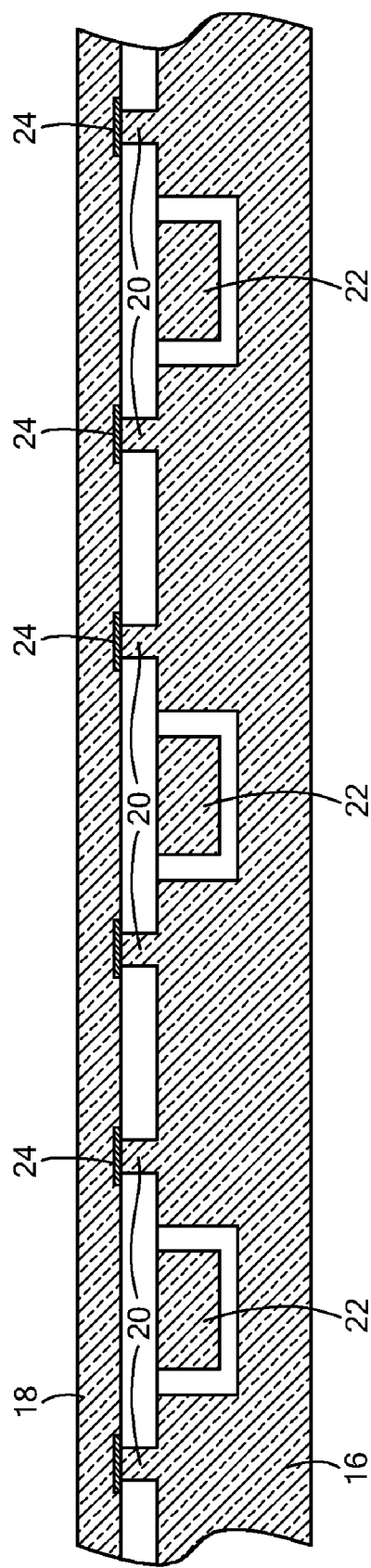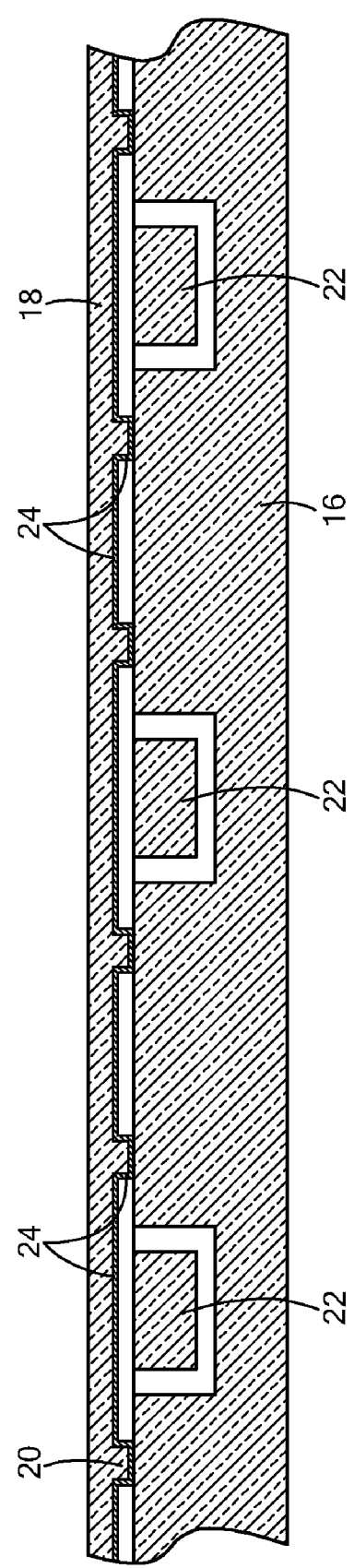

ic components. For example, micro-electromechanical
SUBSTRATE BONDING WITH BONDING MATERIAL HAVING RARE EARTH METAL

PRIORITY

This patent application is a divisional patent application of U.S. patent application Ser. No. 12/434,886, filed May 4, 2009, entitled, "SUBSTRATE BONDING WITH BONDING MATERIAL HAVING RARE EARTH METAL," and naming John R. Martin, Timothy J. Frey, and Christine Tsau as inventors, the disclosure of which is incorporated herein, in its entirety, by reference.

U.S. patent application Ser. No. 12/434,886 claims priority from provisional U.S. Patent Application No. 61/095,754, filed Sep. 10, 2008, entitled, "SUBSTRATE BONDING WITH BONDING MATERIAL HAVING RARE EARTH METALS," and naming John R. Martin, Timothy J. Frey, and Christine Tsau as inventors, the disclosure of which is also incorporated herein, in its entirety, by reference.

RELATED APPLICATION

This patent application is related to U.S. Pat. No. 7,943,411, filed on May 4, 2009, entitled, "APPARATUS AND METHOD OF WAFER BONDING USING COMPATIBLE ALLOY," and naming John R. Martin, Timothy J. Frey, and Christine Tsau as inventors, the disclosure of which is incorporated herein, in its entirety, by reference.

This patent application also is related to co-pending patent application Ser. No. 13/161,108, filed on even date herewith, entitled, "METHOD OF SUBSTRATE BONDING WITH BONDING MATERIAL HAVING RARE EARTH METAL," and naming John R. Martin, Timothy J. Frey, and Christine Tsau as inventors, the disclosure of which is incorporated herein, in its entirety, by reference.

FIELD OF THE INVENTION

The invention generally relates to microchips and, more particularly, the invention relates to bonding substrates when forming microchips.

BACKGROUND OF THE INVENTION

A wide variety of microchips use caps to protect their interior components. For example, micro-electromechanical systems ("MEMS devices") often have a cap to protect their fragile microstructure. Many MEMS devices typically have a glass seal to bond the silicon die caps to the underlying MEMS chip. Such a seal, which can be hermetic, may have widths on the order of about 150 to 400 microns. Undesirably, this seal footprint increases die size, especially when there is little or no support circuitry on the die. As a consequence, fewer dies/microchips can be formed from individual wafers, thus increasing per-unit fabrication costs.

Glass also can introduce contaminants and electrically isolate the cap from the die. Although the latter problem can be accommodated by wirebonding to the cap, such a solution increases package height. One alternative to using a glass seal involves use of a thermocompression bonded metal. Undesirably, however, thermocompression bonding generally requires wafers to have minimal topography due to the high pressures required in such processes.

SUMMARY OF THE INVENTION

In accordance with illustrative embodiments of the invention, a microchip has a bonding material that bonds a first substrate to a second substrate. The bonding material has, among other things, a rare earth metal and other material.

The first substrate may be either a chip or a wafer, and the second substrate also may be either a chip or a wafer. Thus, the bonding material facilitates a chip to chip bonding, a wafer to wafer bonding, or a chip to wafer bonding. Moreover, the bonding material may be a solder or a thermocompression material. The rare earth metal facilitates bonding because, in various embodiments, the other material does not readily bond with the first substrate in the absence of the rare earth metal. The bonding material may have any useful concentration of rare earth metal, such as a concentration of between about 0.1 to 15.0 percent (volume percent).

Therefore, various embodiments allow metals to be applied to one surface and bonded to a second surface with minimal restrictions as to the nature of the second surface. In this respect, it offers application and process versatility that, to the inventors' knowledge, only had been available with glass seal/bond materials or nonhermetic polymeric seal/bond materials.

The bonding material may form a hermetic seal, electrically connect the first substrate and the second substrate, or both. Deposition processes (e.g., sputtering processes) facilitate narrow and small-area bond structures. For example, the bonding material may form a seal ring having a width of less than about 100 microns. In some embodiments, the first wafer has a least one pedestal with a top surface. The bonding material thus is positioned between the second wafer and the top surface of the pedestal. Moreover, the bonding material may substantially cover the interior surface of the first substrate, or cover no more than a portion of the same interior surface.

In accordance with another embodiment of the invention, a method of bonding a first substrate and a second substrate forms at least one pedestal on the first substrate, and deposits bonding material having a rare earth metal onto at least one of the pedestal and the second substrate. The method then contacts the second substrate with the at least one pedestal to form an intermediate apparatus. The bonding material is positioned between the at least one pedestal and the second substrate at this point. The method then heats the intermediate apparatus to cause the bonding material to bond with at least one of the first substrate and the second substrate.

To mitigate oxidation on the bonding material, the method may add a cover material to the bonding material. This act may be performed before contacting the second substrate with the at least one pedestal. In addition, the at least one pedestal may be formed by a number of processes, such as by etching the first substrate or simply securing a member onto a generally flat surface of the first substrate.

Some embodiments heat the intermediate apparatus to form a thermocompression bond between the first substrate and the second substrate. Alternatively, other embodiments may heat the intermediate apparatus to form a solder bond between the first substrate and the second substrate. Moreover, a bonding material may be disposed by sputtering, from a first source, the bonding material onto at least one of the pedestal and the second substrate. The method further may sputter a cover material, from, for example, a second source, onto the bonding material.

If the first and second substrates are wafers, the method may at least partially dice the first and second bonded wafers to produce a plurality of individual chips. Some embodiments also form a via through at least one of the first substrate and the second substrate. Among other things, the first substrate may have micro-electromechanical structure, and the second substrate may form a cap about the micro-electromechanical structure.

In accordance with another embodiment of the invention, a wafer bonding method deposits a metal alloy onto one or both of a MEMS wafer having a two-dimensional array of MEMS devices or a second wafer. In preferred embodiments, the metal alloy has a rare earth metal. The method then aligns the MEMS wafer and the second wafer to form an intermediate apparatus having the metal alloy between the wafers. Next, the method heats the intermediate apparatus and brings the wafers into contact. The step of bringing the wafers into contact may occur before, after or simultaneous with the start of heating. The contact pressure, time and temperature of heating the intermediate apparatus is sufficient to allow the rare earth metal to promote adhesion between at least a portion of the contacting surfaces. The intermediate apparatus is then cooled to form a plurality of substantially conductive hermetic sealing rings about the plurality of MEMS devices on the MEMS wafer.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

FIG. 3 also schematically shows a plan view of a portion of one of those wafers.

FIG. 4 schematically shows a cross-sectional view of two wafers bonded in accordance with alternative embodiments of the invention.

FIG. 5 schematically shows a cross-sectional view of two wafers bonded in accordance with other embodiments of the invention.

DESCRIPTION OF ILLUSTRATIVE EMBODIMENTS

Illustrative embodiments use a bonding material with a rare earth element to bond wafers, chips, or wafers and chips. For example, the bonding material may be a solder and/or a thermocompression material that joins a wafer to another wafer. Details of illustrative embodiments are discussed below.

Figure 1:
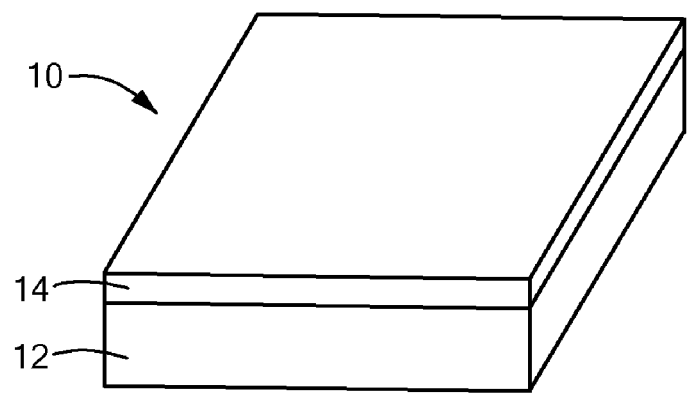
FIG. 1 schematically shows a capped microchip that may be fabricated in accordance with illustrative embodiments of the invention.

FIG. 1 schematically shows a perspective view of a capped microchip 10 fabricated in accordance with illustrative embodiments of the invention. To that end, the microchip 10 has a substrate 12 with functional elements (e.g., circuitry, such as CMOS circuitry, microelectromechanical structure, or both) and a cap 14 circumscribing some or all of the functional elements. For example, the microchip 10 may implement the functionality of an accelerometer, such as that of an ADXL202 IMEMS accelerometer or ADXL330 IMEMS accelerometer, both of which have been distributed by Analog Devices, Inc. of Norwood, Mass. As known by those skilled in the art, the cap 14 protects the fragile microstructure within the MEMS device. It nevertheless should be noted that discussion of a MEMS device or other specific microchip is for illustrative purposes only. Accordingly, details of various embodiments apply to both MEMS and other devices. Additionally, discussion of bonding two wafers, two microchips or a wafer, and a microchip is for illustrative purposes only and does not preclude bonding between other structures or more than two structures.

In accordance with illustrative embodiments of the invention, the microchip 10 has a specially configured seal ring bonding the cap 14 to the substrate 12. Specifically, the seal ring is formed from a bonding material/alloy 24 having, in combination, at least one rare earth metal and a metal/element/alloy. The rare earth metal in the alloy/element enables bonding to wafers/chips that the bonding material 24, under similar bonding conditions, may not bond to absent the rare earth metal. Accordingly, the bonding material 24 readily bonds to both the substrate 12 and the cap 14 to provide a hermetic seal (if required by the application).

As used herein, the term "rare earth" metal or element includes the lanthanide series, as well as scandium and yttrium. For example, in certain applications, lanthanum and yttrium should provide satisfactory results.

Moreover, the seal ring also electrically connects the cap 14 with the substrate 12, thus allowing the potential between the cap 14 and the substrate 12 to be controlled. Accordingly, due to the high chemical reactivity of the rare earth metal within the alloy, the surfaces of the cap 14 and the substrate 12 do not require extensive surface scrubbing or additional preparation steps.

Use of the rare earth metal enables a wide range of potential materials for use as the bonding material 24. For example, metals having low toxicity and low contamination may be more preferable to bond the cap 14 to the substrate 12. As discussed in greater detail below, the seal ring may be formed through a number of processes, such as a soldering process, an alloy-forming process, or a thermocompression process. Unlike many solders, however, the seal ring may have a very small width, such as on the order of about 100 microns. As such, the seal ring should occupy less chip real estate than many prior art seal rings, favorably reducing the overall chip size.

Figure 2:
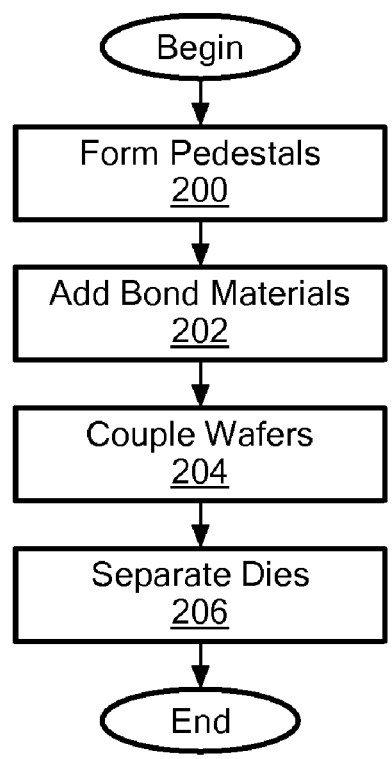
FIG. 2 shows a process of forming the capped microchip of FIG. 1 in accordance with illustrative embodiments of the invention.

FIG. 2 shows a general process of forming the microchip 10 of FIG. 1 in accordance with illustrative embodiments of the invention. It should be noted that this method is a simplified summary of the overall process of forming the microchip 10 and thus, does not include a number of other steps that may be included, such as chip testing and preparation of certain equipment. Moreover, some steps may be performed in a different order, or, in some instances, omitted.

In general, the process of FIG. 2 forms a plurality of microchips (e.g., the microchip 10 of FIG. 1) in parallel by simultaneously fabricating a two dimensional array of individual devices (e.g., MEMS devices) on a device wafer 16 (shown in FIGS. 3-5, discussed below), and sealing each of those devices with caps 14 formed from a single cap wafer 18 (also shown in FIGS. 3-5, discussed below). Some embodiments, however, process a single device at a time and thus, do not employ these noted batch processes.

The process of FIG. 2 begins at step 200, which forms pedestals 20 on the surface of the substrate 12. Specifically, FIG. 3 schematically shows a device wafer 16 having a two dimensional array of MEMS devices, and a cap wafer 18 for protecting the MEMS devices on the device wafer 16. The cap wafer 18 in this embodiment has a generally flat topography, while the device wafer 16 has a relatively complex topography. For example, if implementing MEMS accelerometers, the device wafer 16 generally may have a topology similar to that disclosed by U.S. Pat. No. 5,939,633, owned by Analog Devices, Inc. and incorporated herein, in its entirety, by reference.

Accordingly, conventional micromachining processes form each of the plurality of devices on the device wafer 16 to have, among other things, a plurality of springs (not shown) movably supporting a mass 22 above the substrate 12. FIG. 3 schematically shows the mass 22 supported above the substrate 12 in this manner. The process also may form vias (not shown) and/or bond pads (not shown) to electrically connect with the mass 22 and/or circuitry of each device.

As noted above, illustrative embodiments form a plurality of pedestals 20 that each generally circumscribe the movable mass 22 of one device. In other words, each device has at least one pedestal 20 around its mass 22. Optionally, the pedestal 20 of a device may enclose more than one mass 22, and a device may have more than one pedestal 20. To reduce process steps and improve efficiency, the method preferably forms these pedestals 20 as it forms the movable mass 22, springs, and other microstructure on the device wafer 16.

By way of example, the pedestals 20 may be formed by etching material from the device wafer 16. Accordingly, if the device wafer 16 is formed from single crystal silicon, then the pedestals 20 also are formed from single crystal silicon (i.e., because they are integral with and formed from the device wafer 16). Alternatively, the method may form the pedestals 20 by disposing a material onto the device wafer 16. For example, the method may deposit polysilicon onto the device wafer 16 to form the pedestals 20. Optionally, a dielectric material can be used to form pedestal 20, or as a layer under some or all of pedestal 20, to electrically isolate selected regions of substrate 12 from cap 14. In yet another embodiment, the method may secure separate, pre-made circumscribing components onto the device wafer 16.

If the cap wafer 18 is very close to the device wafer 16, then the two wafers effectively may form a capillary that wicks the bonding material 24 across the microstructure (if the bonding material 24 is in a liquid state). The height of the pedestals 20 thus should be controlled to avoid this undesirable consequence if the bonding material is in a liquid state. One advantage of processing at a temperature below the melting point is that such capillary wicking effects are avoided. If the bonding process is close to, but below, the melting point, the bonding material is soft. Therefore, moderate force is sufficient to deform the bonding material 24 to accommodate normal variations in wafer topography. In this discussion, the term "melting point" refers to the temperature at which the solid becomes a liquid, and such term is intended to broadly cover solid-liquid phase transitions, such as those that occur in mixtures at a eutectic point.

To reduce the chip real estate required for the seal ring being formed, illustrative embodiments form the pedestals 20 to have a very small width. For example, the pedestals 20 may have a width of about 100 microns or less. Of course, some embodiments may form the pedestals 20 to have greater widths and thus, pedestal widths greater than 100 microns may still be within the scope of various embodiments of the invention.

After forming the pedestals 20, the method adds bonding material 24, which includes a rare earth metal, to one of the wafers (step 202). The method may add the bonding material 24 in any number of ways. FIG. 3 shows a method of adding the bonding material 24 to the entire bottom surface of the cap wafer 18. This material may be added using any number of a variety of conventional techniques, such as sputtering, blanket coating, other processes.

Figure 3:
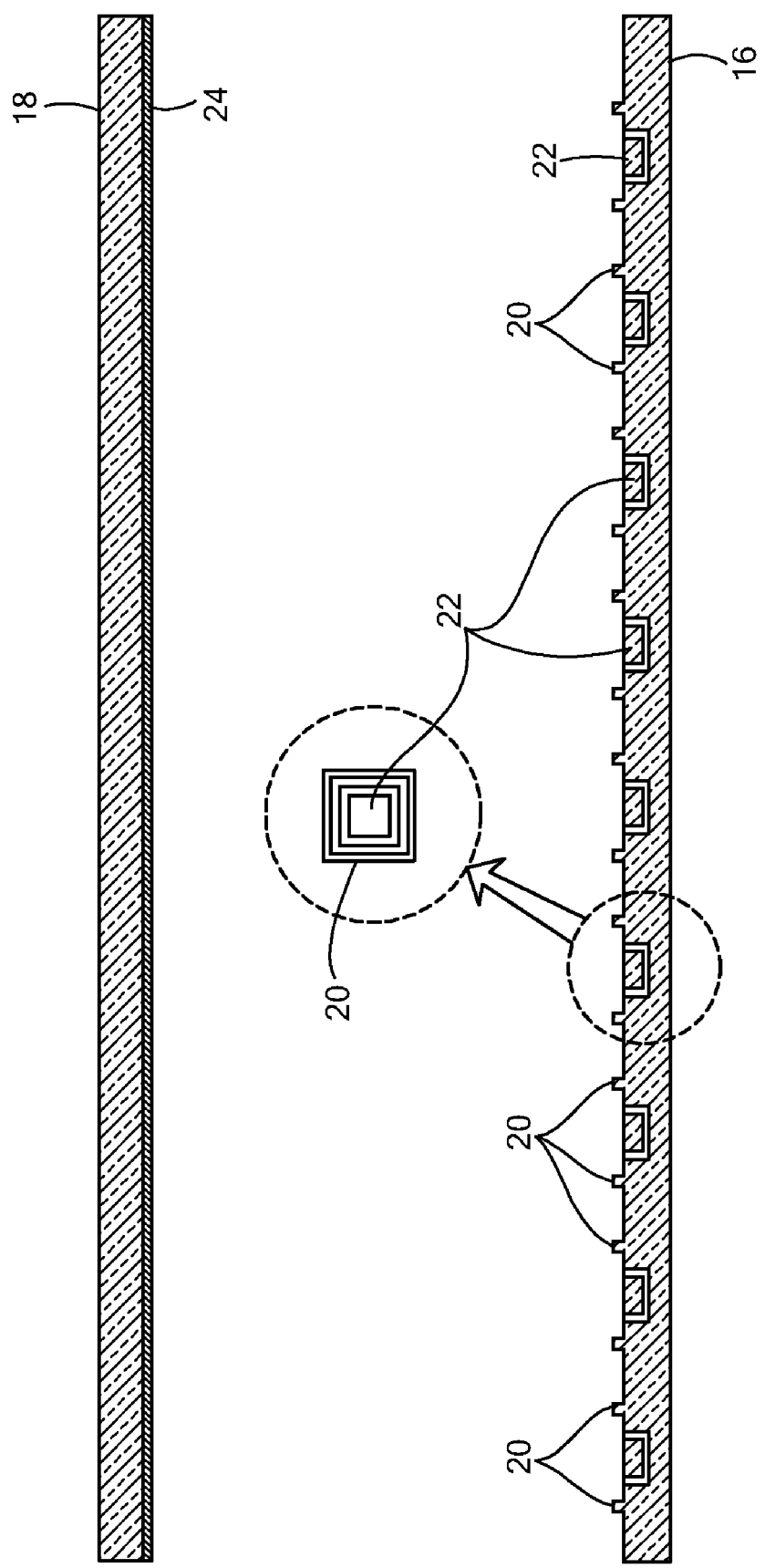
FIG. 3 schematically shows a cross-sectional view of two wafers to be bonded in accordance with illustrative embodiments of the invention.

In one embodiment, the method sputters a 0.5 to 4.0 micron thick alloy of tin and rare earth metal onto the bottom of the cap wafer 18 (e.g., see FIG. 3). For example, the method first blanket sputters tin or a tin alloy onto the cap wafer 18, and then, without breaking vacuum, sputters a rare earth metal onto the tin layer. Alternatively, rather than sequentially applying the alloy materials, the method sputters a mixture alloy including the rare earth metal onto the appropriate surface.

Next, the method may sputter a thinner layer (e.g., 0.05 to one micron thick) of material that does not contain rare earth metal, onto the first layer. This second layer primarily acts as an oxygen barrier to prevent/mitigate oxidation of the rare earth alloy. As such, this layer can be referred to as a "cover layer." The cover layer may be the material used in the first layer (tin or tin alloy in the embodiment described above), or a different material, such as gold.

It should be noted that discussion of a sputtering process is for simplicity only and thus, not intended to limit other embodiments of the invention. For example, some embodiments may apply the bonding material 24 using a transfer process. Accordingly, those skilled in the art may use other techniques for applying the bonding material 24 to the appropriate wafer 16 or 18.

Alternatively, the method may add the bonding material 24 to both wafers 16 and 18, or to the top facing surface of the pedestal rings 20 on the device wafer 16.

Any number of different alloys may be used, depending upon the application. Toxicity, contamination, and other factors should be taken into consideration. For example, many applications require a lead-free alloy. In addition to lead, toxicity also discourages use of other materials, such as cadmium and mercury. Alloys and the cover material also may be selected based upon their eutectic temperature. For example, higher eutectic temperature materials/alloys (e.g., above 300 degrees C.) should be considered based on the requirements of subsequent thermal exposures. For example, if the die will subsequently be packaged in plastic using standard transfer molding techniques, the alloy should be capable of withstanding the 175 degree C. transfer molding process temperature.

As another example, CMOS devices should avoid deep level trap metals, such as gold. Specifically, various embodiments select from metals customarily used in a CMOS wafer fabrication plant. Among others, those metals include aluminum, germanium, tungsten, and titanium. Such types of metals are considered to be "CMOS compatible" metals. In one illustrative embodiment of forming bond material 24, 0.5 to 4 microns of aluminum or an aluminum alloy suitable for use in a CMOS wafer fabrication facility may be deposited on an optional barrier/bonding layer, such as titanium-tungsten. A rare earth metal layer, 0.1 to 1.0 microns thick, is then deposited on this aluminum or aluminum alloy, followed by a thin cover layer that may conveniently be the same aluminum or aluminum alloy. The aluminum alloys used for interconnect layers of integrated circuit wafers are one class of alloys that may be useful in this embodiment. Alloys of aluminum and germanium are also attractive for this embodiment because they have a relatively low melting temperature (424 degrees C. for the eutectic composition). Metals are soft and readily deformed near their melting temperature, so use of a low melting temperature alloy allows bond surfaces to be pressed into atomic scale contact at relatively low pressure and temperature. This is particularly advantageous for delicate or thermally sensitive materials, or those with a high bond area such that achieving atomic scale contact requires that the applied bond force approach or exceed the limits of available equipment.

Further material constraints may arise in other applications. For example, in stiction sensitive applications, alloy selection may be limited to metals having negligible vapor pressure at anticipated bonding temperatures. In addition, the exposed metal (i.e., the source of vapor) may be minimized by removing it from the cap wafer cavity surface. Metals such as indium and bismuth therefore may cause stiction if they are volatilized and inadvertently deposited onto closely spaced microstructures during the wafer bonding process. Moreover, tin undesirably can spontaneously generate whiskers. In fact, addition of a rare earth metal to tin appears to enhance this characteristic. Post-treating the seals and interconnects with an atomic layer deposition film may reduce this phenomenon.

One of ordinary skill in the art thus should select the appropriate base alloy or element to mix with a rare earth metal based upon the intended application. The base alloy may include binary alloys, such as those based on tin/silver, gold/tin, gold/silicon/and germanium/aluminum. For example, 96.5 tin-3.5 silver has an eutectic temperature at about 221 degrees C., 55 germanium-45 aluminum has an eutectic temperature at about 424 degrees C. Addition of a small amount of rare earth metal should not appreciably change the eutectic process temperatures. Alloys having more than two elements also may receive a rare earth metal for the noted purposes. Other embodiments may use single element base materials, such as aluminum.

Illustrative embodiments add a relatively small percentage of rare earth metal to the base alloy. The method selects the appropriate percentage primarily based upon the bonding strength desired for the ultimate alloy. For example, the rare earth alloy may have a concentration of between about 0.1 and about 15.0 percent rare earth metal. More specifically, the rare earth alloy may have a concentration of between about 0.5 and about 10.0 percent rare earth metal.

After adding the bonding material 24, the process continues to step 204, which couples together the substrate and cap wafers 16 and 18 to form an "intermediate apparatus." To that end, conventional processes adhere the bonding material 24 to one or both of the wafers, and bring the wafers together. Due to the nature of the structure and bonding material 24, however, illustrative embodiments do not necessarily require precise alignment to bring the wafers together. In fact, the surfaces often do not require special surface preparation—instead, the surfaces are ready for bonding. Alternative embodiments, however, may prepare the surfaces, such as by removing any surface oxides that could reduce bonding efficiency.

The bonding material 24 may be a solder, a thermocompression material or other material sufficient to accomplish the desired goals. If it is a solder, then conventional processes heat the bonding material 24 to a temperature and pressure sufficient to ensure intimate contact at the bond surfaces of the wafers. The temperature and time of contact should be sufficient to allow the rare earth metal to diffuse to the interface and promote adhesion between the wafer surfaces. Similarly, if using a cover layer on tin alloy/rare earth layers or aluminum alloy/rare earth layers, then this step allows the materials to interdiffuse such that the rare earth metal promotes adhesion between the wafer surfaces. The bonding material 24 of this embodiment thus connects between the top surface of each pedestal 20 and the face of the cap wafer 18.

Each pedestal 20 and accompanying bonding material 24 thus is considered to form a seal ring around its respective microstructure. It should be noted that use of the term "ring" should not be construed to suggest that the seal ring takes on any particular shape. Instead, each seal ring may be any reasonably appropriate shape as required by the application and chip design process. For example, FIG. 3 shows a generally rectangular seal ring. Optionally, the pedestal 20 of a device/microchip 10 may enclose more than one mass 22, and/or a device/microchip 10 may have more than one pedestal 20.

If it is a thermocompression material, then the process does not heat the bonding material 24 to its liquid phase. Instead, the process uses thermocompressive bonding techniques by applying forces at prespecified temperatures and times to achieve atomic scale contact of the bond surfaces, and allow the rare earth metal to diffuse to the interface to promote bonding between those surfaces. Of course, selection of an appropriate bonding material 24 (e.g., a rare earth metal with aluminum or an aluminum alloy) enables the method to reduce the thermocompression temperature.

Some embodiments do not use an entirely different cover layer material, such as gold, to prevent oxidation of the rare earth alloy layer. For example, a rare earth alloy with aluminum may simply use an aluminum cover layer to prevent oxidation. Specifically, as known by those skilled in the art, aluminum oxide is generally brittle and thus, should diffuse into the aluminum when subjected to high temperatures and pressures of a thermocompression process. Alternatively, the inventors believe that some rare earth alloys, such as the noted aluminum alloy, may not require a cover layer. Specifically, the inventors believe that aluminum oxide formed on the exposed face of the rare earth/aluminum alloy may substantially mitigate formation of oxides normally associated with rare earth metals.

The method concludes at step 206, which separates the dies from their respective wafers 16 and 18. Specifically, after permitting the coupled wafers 16 and 18 to cool a sufficient period of time, conventional dicing processes may cut the bonded wafers to produce a plurality of independent microchips 10. Among others, conventional saw or laser dicing processes may separate the dies 10.

Some embodiments may cut only one wafer, and cut the other wafer at a subsequent processing step. For example, the method may cut the cap wafer 18 only, thus exposing a portion of the device wafer 16 (e.g., exposing bond pads). Subsequent testing processes may use these bond pads to test the microchips 10 before dicing the device wafer 16.

Illustrative embodiments may use any of a number of techniques for aligning the cutting mechanism with the two bonded wafers. For example, some embodiments may use infrared sensors or other optical applications from the sides of the device wafer 16. Other embodiments may remove some of the bonding material 24 before bonding, or selectively deposit the bonding material 24 onto the cap wafer 18 to facilitate alignment vision systems. FIG. 4 schematically shows one such embodiment.

FIG. 5 schematically shows another embodiment with an opposite pedestal arrangement; namely, the pedestals 20 are formed on/from the cap wafer 18. To that end, this method may pattern and etch the cap wafer 18, and then deposit the bonding material 24 discussed above. Similar application techniques may be used. For example, conventional sputtering techniques may apply the bonding material 24 as a blanket coat, and optionally remove portions of it as shown in FIG. 4. Alternatively, in this and other embodiments, the bonding material 24 may be stamped using a transfer printing process or formed using a method such as inkjet printing. For example, this process may use a solder film (hot wafer or molten solder). As an alternative step, the transfer equipment may scrub the wafer to ensure that surface oxide does not affect contact quality. Other embodiments may thin-film pattern and etch the bonding material 24.

Some embodiments use the bonding material 24 without the pedestals 20. Instead, in those cases, the bonding material 24 alone may act as the seal ring. In yet other embodiments, both wafers 16 and 18 have pedestals 20.

Accordingly, various embodiments of the invention provide a solution to a long felt need in the art. Specifically, among other things, the bonding material 24 provides a conductive bond that readily couples with a wide variety of material surfaces. The resulting bond, which may be formed between two wafers, two chips, or a chip and a wafer—with or sometimes without alignment—should take up less chip real estate. For example, a tin/rare earth, aluminum/rare earth, or aluminum-germanium/rare earth bonding material should provide a hermetic, conductive bond with a much smaller width than that of a conventional glass frit bond. Consequently, the bonding material 24 aids in reducing chip size, causing wafer fabrication yield to increase, thus driving down per-part costs. In addition, illustrative embodiments permit bonding by metalizing one of two surfaces only (e.g., only one wafer surface is metalized in a wafer-to-wafer bond).

Although the above discussion discloses various exemplary embodiments of the invention, it should be apparent that those skilled in the art can make various modifications that will achieve some of the advantages of the invention without departing from the true scope of the invention. In addition, characteristics of the described embodiments may be combined to yield similar results.

What is claimed is:

1. A microchip comprising:
a first semiconductor substrate having at least one pedestal ring with a top surface;
a second semiconductor substrate; and
a bonding material bonding the first and second substrates, the bonding material comprising an alloy comprising a rare earth metal and other conductive metal,
the bonding material being between the second substrate and the top surface of the pedestal ring, the bonding material, pedestal ring, first substrate and second substrate forming a chamber containing MEMS structure.

2. The microchip as defined by claim 1 wherein the first substrate comprises a chip or a wafer and the second substrate comprises a chip or a wafer.

3. The microchip as defined by claim 1 wherein the first substrate comprises a wafer having a plurality of MEMS devices, the second substrate comprising a wafer having a plurality of caps, the bonding material forming a plurality of sealing rings hermetically sealing the MEMS devices.

4. The microchip as defined by claim 1 wherein the first substrate has an interior surface, the bonding material substantially covering the interior surface.

5. The microchip as defined by claim 1 wherein the other material does not readily bond with the first substrate in the absence of the rare earth metal.

6. The microchip as defined by claim 1 wherein the bonding material electrically connects the first substrate and the second substrate.

7. The microchip as defined by claim 1 wherein the bonding material forms a seal ring having a width of less than about 100 microns.

8. The microchip as defined by claim 1 wherein the at least one pedestal ring is formed at least in part from a semiconductor material and is integral with the first semiconductor substrate.

9. A microchip comprising:
a first substrate;
a second substrate; and
a bonding material bonding the first and second substrates, the bonding material comprising a rare earth metal and other material,
wherein the other material does not readily bond with the first substrate in the absence of the rare earth metal.

10. The microchip as defined by claim 9 wherein the first substrate comprises a chip or a wafer and the second substrate comprises a chip or a wafer.

11. The microchip as defined by claim 9 wherein the first substrate comprises a wafer having a plurality of MEMS devices, the second substrate comprising a wafer having a plurality of caps, the bonding material forming a plurality of sealing rings hermetically sealing the MEMS devices.

12. The microchip as defined by claim 9 wherein the first substrate has an interior surface, the bonding material substantially covering the interior surface.

13. The microchip as defined by claim 9 wherein the bonding material electrically connects the first substrate and the second substrate.

14. The microchip as defined by claim 9 wherein the bonding material forms a seal ring having a width of less than about 100 microns.

15. The microchip as defined by claim 9 wherein the first substrate has at least one pedestal ring with a top surface, the bonding material being between the second substrate and the top surface of the pedestal ring.

16. A microchip comprising:
a first substrate;
a second substrate; and
a bonding material bonding the first and second substrates, the bonding material comprising a rare earth metal and other material,
the bonding material forming a seal ring having a width of less than about 100 microns.

17. The microchip as defined by claim 16 wherein the first substrate comprises a chip or a wafer and the second substrate comprises a chip or a wafer.

18. The microchip as defined by claim 16 wherein the first substrate comprises a wafer having a plurality of MEMS devices, the second substrate comprising a wafer having a plurality of caps, the bonding material forming a plurality of sealing rings hermetically sealing the MEMS devices.

19. The microchip as defined by claim 16 wherein the first substrate has an interior surface, the bonding material substantially covering the interior surface.

20. The microchip as defined by claim 16 wherein the other material does not readily bond with the first substrate in the absence of the rare earth metal.

21. The microchip as defined by claim 16 wherein the bonding material electrically connects the first substrate and the second substrate.

22. The microchip as defined by claim 16 wherein the first substrate has at least one pedestal ring with a top surface, the bonding material being between the second substrate and the top surface of the pedestal ring.

* * * * *